(12) United States Patent
Gabriel et al.

(10) Patent No.: US 7,612,895 B2
(45) Date of Patent: Nov. 3, 2009

(54) APPARATUS AND METHOD FOR IN-SITU MONITORING OF WAFER BONDING TIME

(75) Inventors: Markus Gabriel, Garching/Munich (DE); Matthew Stiles, Waterbury, VT (US)

(73) Assignee: SUSS MicroTec Inc, Waterbury Center, VT (US)

( * ) Notice: Subject to any disclaimer, the term of this patent is extended or adjusted under 35 U.S.C. 154(b) by 4 days.

(21) Appl. No.: 12/118,100

(22) Filed: May 9, 2008

(65) Prior Publication Data

US 2008/0285059 A1    Nov. 20, 2008

Related U.S. Application Data

(60) Provisional application No. 60/938,819, filed on May 18, 2007.

(51) Int. Cl.
*G01B 11/14* (2006.01)
*H01L 21/66* (2006.01)

(52) U.S. Cl. .................. 356/623; 438/16; 438/617; 438/7

(58) Field of Classification Search ......... 356/614–623; 438/16, 455, 7–9, 612, 617
See application file for complete search history.

(56) References Cited

U.S. PATENT DOCUMENTS

| | | | |
|---|---|---|---|
| 4,806,193 A | | 2/1989 | Von Raben et al. |
| 5,323,952 A | | 6/1994 | Kato et al. |
| 6,214,718 B1 | * | 4/2001 | Nagai et al. ............. 438/617 |
| 6,279,810 B1 | | 8/2001 | Chan-Wong et al. |
| 6,881,596 B2 | * | 4/2005 | Malville et al. ............ 438/16 |
| 2004/0014298 A1 | * | 1/2004 | Ehrke et al. ............. 438/455 |
| 2006/0085965 A1 | * | 4/2006 | Suga et al. ................. 29/514 |

OTHER PUBLICATIONS

Shari Farrens, "Vertical Integration: A Confederacy of Alignment, Bonding, and Materials Technologies", Mater. Res. Soc. Symp. Proc., 2007, vol. 970.

* cited by examiner

*Primary Examiner*—Hoa Q Pham
(74) *Attorney, Agent, or Firm*—AKC Patents LLC; Aliki K. Collins

(57) ABSTRACT

An apparatus and a method for semiconductor wafer bonding provide in-situ and real time monitoring of semiconductor wafer bonding time. Deflection of the wafer edges during the last phase of the direct bonding process indicates the end of the bonding process. The apparatus utilizes a distance sensor to measure the deflection of the wafer edges and the bonding time is measured as the time between applying the force (bonding initiation) and completion of the bonding process. The bonding time is used as a real-time quality control parameter for the wafer bonding process.

16 Claims, 8 Drawing Sheets

APPARATUS AND METHOD FOR IN-SITU MONITORING OF WAFER BONDING TIME

CROSS REFERENCE TO RELATED CO-PENDING APPLICATIONS

This application claims the benefit of U.S. provisional application Ser. No. 60/938,819 filed May 18, 2007 and entitled "APPARATUS AND METHOD FOR IN-SITU MONITORING OF WAFER BONDING TIME", the contents of which are expressly incorporated herein by reference.

FIELD OF THE INVENTION

The present invention relates to an apparatus and a method for semiconductor wafer bonding, and more particularly to in-situ monitoring and measuring of the semiconductor wafer bonding time.

BACKGROUND OF THE INVENTION

Direct wafer bonding refers to a process where two separate wafer surfaces are brought into contact and are bonded without any intermediate adhesives or external force. The initial bond strength is usually weak, and therefore a subsequent annealing step is generally carried out to strengthen the bond. Wafer bonding is deployed in a wide range of semiconductor process applications including substrate engineering and fabrication of integrated circuits, packaging and encapsulation of micro-electro-mechanical-systems (MEMS) and stacking of many processed layers (3D-integration) of pure microelectronics.

The quality of the wafer bond plays an important role in the overall semiconductor production yield and cost. Therefore, monitoring and characterization of the bond quality during processing and post-processing is desired. Quick and nondestructive bond quality measurement methods are preferred on the wafer level. Examples of nondestructive bond quality measurement methods include acoustical and optical methods. These methods are applied post bonding and measure the quality of the bond in terms of interface defects. A pre-selection of known-good dies is done after singulation, and the bond strength and other parameters like hermeticity are tested in a sample test with destructive methods. In cases where micro-sensors will be used for human safety applications each device must pass a sequence of harsh environmental tests. All these prior art wafer bond testing methods deal with post bonding metrology. However, in many applications it is desirable to monitor the wafer bonding process and bond quality in-situ and in real time. Monitoring of the bonding time in a production type environment is not practiced today due to the lack of technical solutions. Optical methods deploying infra-red (IR) light, as shown in FIG. 1, are typically used for a post bond void inspection. A set up for monitoring of the bonding based on the IR inspection system is incorporated in the ABC200 and the ELAN SOI300 systems manufactured by SUSS MicroTec. These systems however do not incorporate automated bonding and bond time monitoring. Accordingly, there is a need for a system that provides in-situ and in real time wafer bonding time monitoring.

SUMMARY OF THE INVENTION

In general, in one aspect, the invention features a method for measuring the bonding time in-situ and in real time during a bonding operation between two semiconductor structures. The method includes the following steps. First, positioning a first surface of a first semiconductor structure directly opposite and in contact with a first surface of a second semiconductor structure. Next, initiating bonding between the first surfaces of the first and second semiconductor structures by applying a force at a first point of a second surface of the first semiconductor and thereby forming a bond interface between the first surfaces of the first and second semiconductor structures. The second surface is opposite to the first surface of the first semiconductor structure. Next, measuring a deflection of a second point of the second surface of the first semiconductor away from the first surface of the second semiconductor structure during the propagation of the bond interface throughout the entire first surface areas of the first and second semiconductor structures. The second point is positioned at a first distance from the first point. Finally, measuring the bonding time by taking the difference between the time the deflection reaches a minimum value and the time the force is applied.

Implementations of this aspect of the invention may include one or more of the following features. The second point may be positioned diametrically opposite to the first point. The first point may be located at the center of the second surface of the first semiconductor structure and the second point may be located at an edge of the second surface. The deflection of the second point of the second surface of the first semiconductor away from the first surface of the second semiconductor structure initially increases and then decreases to the minimum value. The deflection may be measured with a distance sensor. The distance sensor may be a laser distance sensor operating on the principle of laser triangulation. The method may further include calculating a bond propagation speed by dividing the first distance between the first and second points by the bonding time. The method may further include calculating a bond quality value by taking the difference between the measured bonding time and a previously determined optimum bonding time.

In general, in another aspect, the invention features an apparatus for measuring the bonding time during a bonding operation between two semiconductor structures. The apparatus includes equipment for positioning a first surface of a first semiconductor structure directly opposite and in contact with a first surface of a second semiconductor structure, equipment for initiating bonding between the first surfaces of the first and second semiconductor structures by applying a force at a first point of a second surface of the first semiconductor and thereby forming a bond interface between the first surfaces of the first and second semiconductor structures, equipment for measuring a deflection of a second point of the second surface of the first semiconductor away from the first surface of the second semiconductor structure, during the propagation of the bond interface throughout the entire first surface areas of the first and second semiconductor structures, and equipment for measuring the bonding time by taking the difference between the time the deflection reaches a minimum value and the time the force is applied. The second surface is opposite to the first surface of the first semiconductor structure and the second point is positioned at a distance from the first point.

The details of one or more embodiments of the invention are set forth in the accompanying drawings and description below. Other features, objects and advantages of the invention will be apparent from the following description of the preferred embodiments, the drawings and from the claims.

BRIEF DESCRIPTION OF THE DRAWINGS

Referring to the figures, wherein like numerals represent like parts throughout the several views:

FIG. 5D is a schematic side view diagram of the completed bonding process;

DETAILED DESCRIPTION OF THE INVENTION

The presented invention describes a method and an apparatus for monitoring the bonding time in direct wafer bonding processes in commercial bonding equipment.

Figure 1:
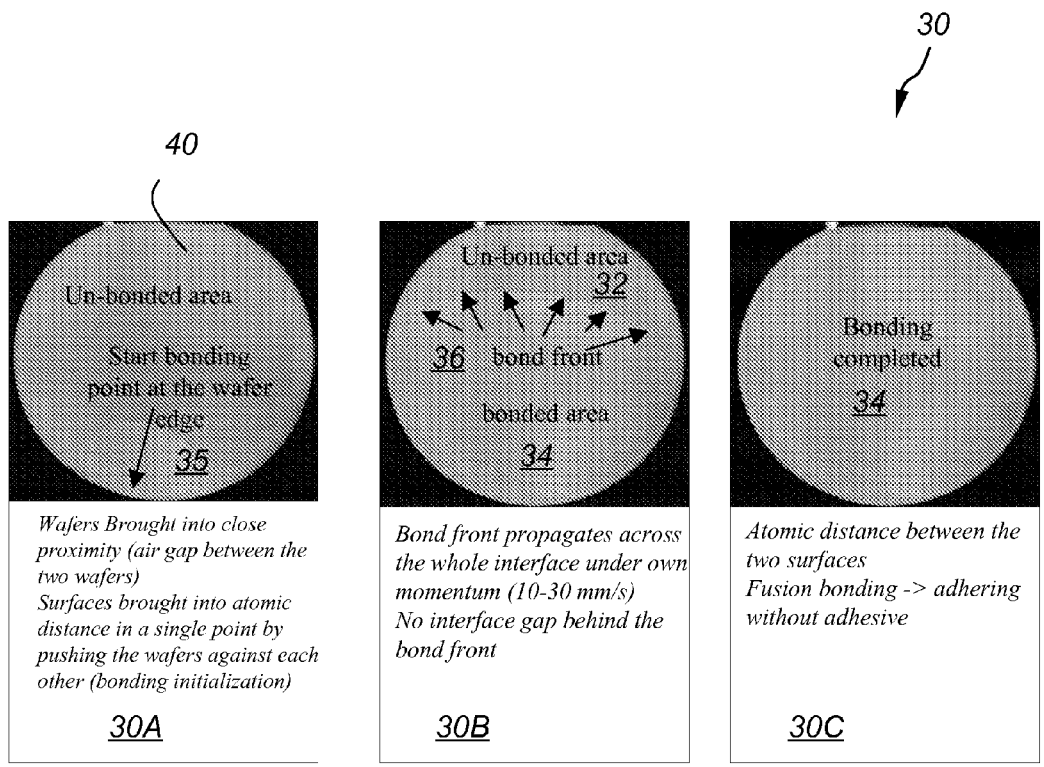
FIG. 1 depicts IR images of the various wafer bonding phases.

Direct wafer bonding process can be viewed as a three-step process sequence, including surface activation, room temperature bonding and annealing. The room temperature bonding, also known as pre-bonding is based on inter-atomic and intermolecular forces, also known as Van-der-Waals forces, hydrogen or water bridges. These forces are relatively weak. However, in many cases, a spontaneous bonding of two clean and flat surfaces occurs when initiated only in one single point. Typically the bonding is initiated in the center or at the edge. Once the bonding is initiated a so-called bonding front propagates across the bonding interface, as shown in the IR images of FIG. 1. Referring to FIG. 1, in a first step two wafer surfaces 40 are brought into close proximity so that there is a small air gap between them and then they are pushed together in a single point 35 to reach an atomic scale distance between the wafer surfaces in that single point (30A). As was mentioned above, this point 35 is usually at the edge or the center of the wafers 40. Next, the bond front 36 propagates across the whole interface under its own momentum at a speed of 10 to 30 millimeters per second leaving behind a bonded area 34 without an interface gap (30B). Finally, the bond front 36 reaches the opposite edge of the wafer surface and the bonding is completed (30C). The bond front propagation speed and bonding time depend on many substrate parameters such as material, bow, flatness, micro-roughness and cleanliness. Device design and relative bond surface play also a major role in the bond front propagation. Finally pretreatment of the bond surfaces has impact on bonding time. Tracking of the bonding time is an important parameter in production of silicon-on-insulator (SOI) wafers, because this information provides insights on previous cleaning and activation processes. Real-time monitoring of the bonding time is also desirable for improving the statistical process control capabilities of the bonding process.

Figure 2:
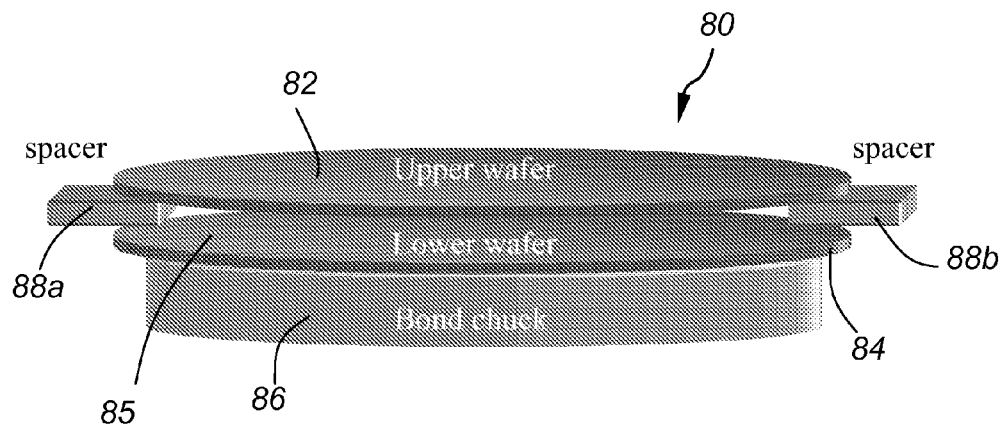
FIG. 2 is a schematic diagram of a two wafer bonding set-up at the stage before the bonding.
Figure 3:
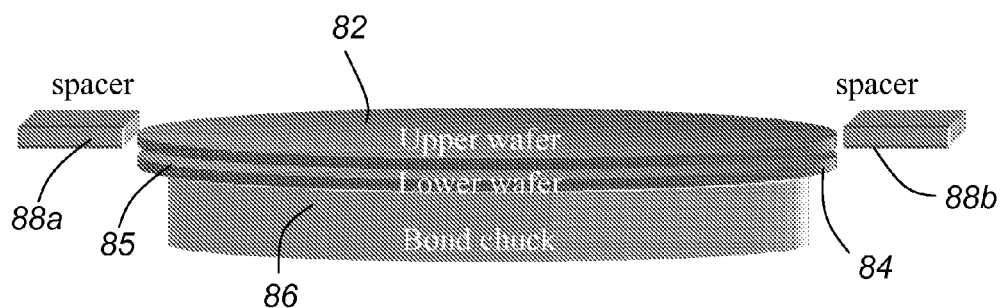
FIG. 3 is a schematic diagram of the two wafer bonding set-up of FIG. 2 at the stage where the top wafer floats on top of the lower wafer.
Figure 4:
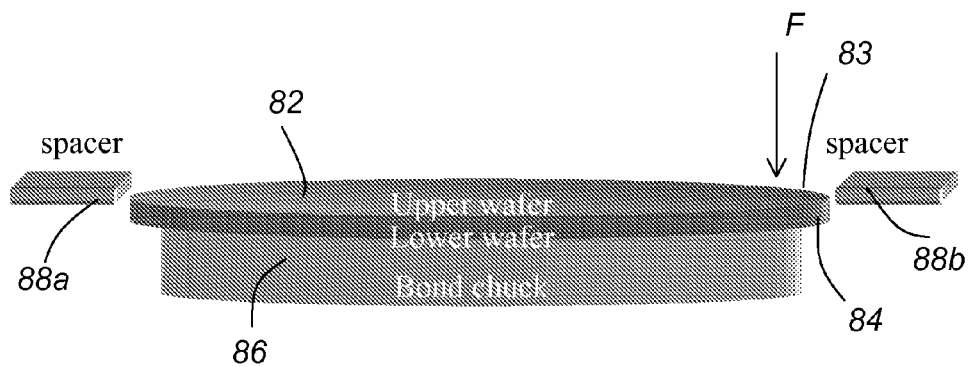
FIG. 4 is a schematic diagram of the two wafer bonding set-up of FIG. 2 at the stage where the bonding is completed.

Referring to FIG. 2, in a direct bonding process 80 typically the wafers are oriented horizontally. The lower wafer 84 is placed face up on a flat carrier (chuck) 86 with a specific diameter. Mechanical spacers 88a, 88b are placed at the edges of the top surface of lower wafer 84 and the upper wafer 82 is placed face down on the mechanical spacers 88a, 88b. A proximity gap 85 between the wafers is defined by the spacer thickness and position, as shown in FIG. 2. Next, the spacers 88a, 88b are removed and the upper wafer 82 floats on top of the lower wafer 84 because of the air cushion 85 between the two flat surfaces, shown in FIG. 3. Next, a force F is applied at one single point 83 (typically at wafer edge or center) to bring the wafers 82, 84 in atomic contact and initiate the bonding based on Van-der-Waals forces. A linear or circular bond front propagates, moving the air out of the interface 85 and leaving the surfaces in atomic contact, as shown in FIG. 4.

The floating properties of the upper wafer 82 on top of the lower one 84 before bonding and the elastic behavior of the wafers during the bonding process are utilized in the present invention to monitor the bonding time. The changes of the floating properties and the elastic behavior are measured and brought into relation with the time between applying the force (i.e., bonding initiation) and completion of the bonding process to monitor the bond time.

Figure 5A:
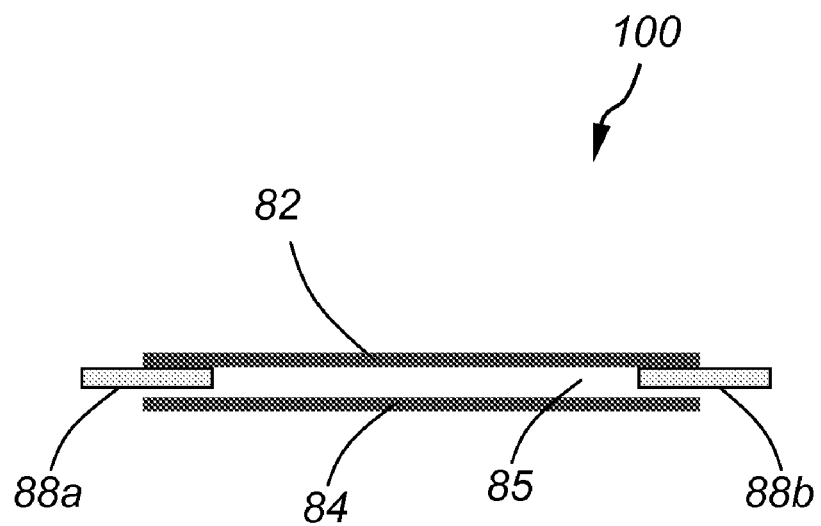
FIG. 5A is a schematic side view diagram of the wafers separated by spacers.
Figure 5B:
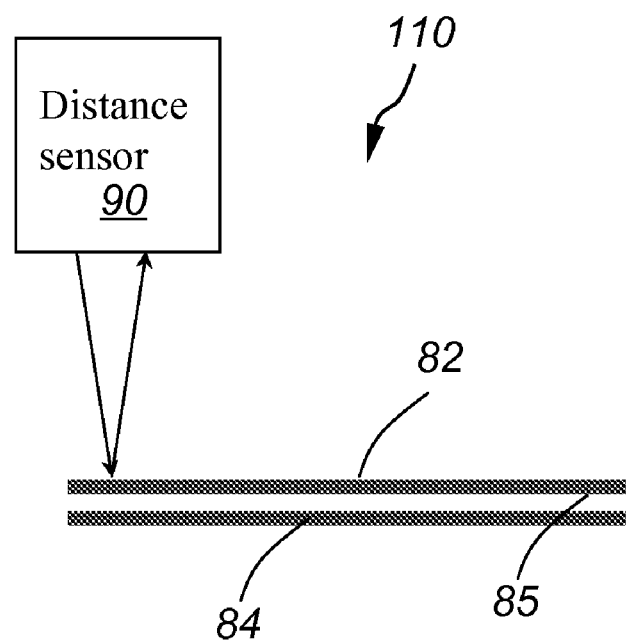
FIG. 5B is a schematic side view diagram of the top wafer floating on top of the lower wafer separated by an air gap.
Figure 5C:
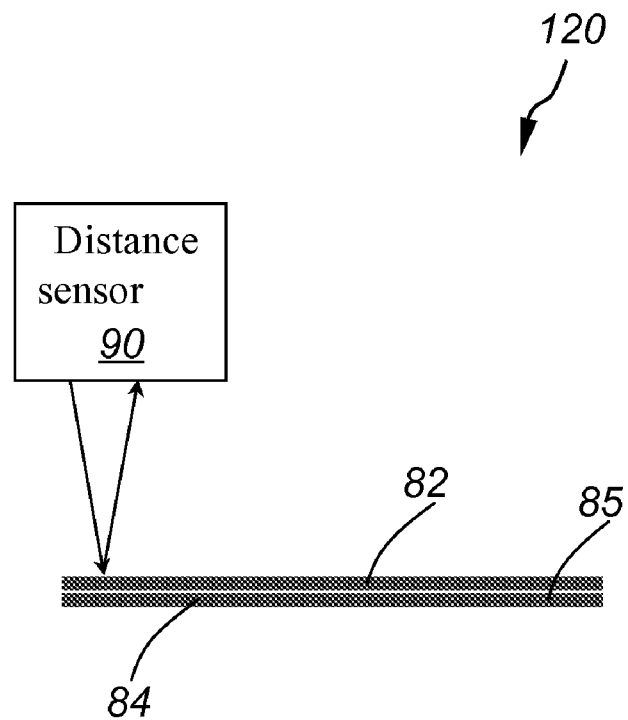
FIG. 5C is a schematic side view diagram of the two wafers separated by a microscopic air gap layer.
Figure 5D:
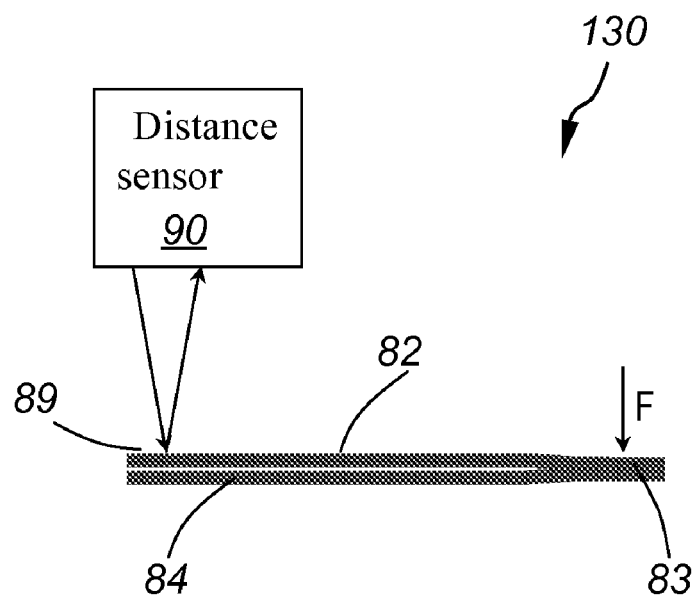
FIG. 5D is a schematic side view diagram of the bond initiation stage.
Figure 5E:
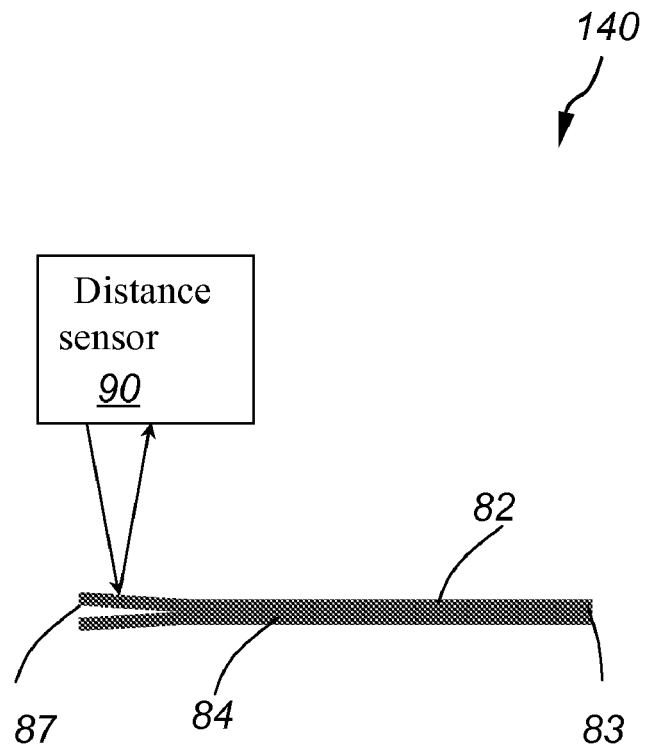
FIG. 5E is a schematic side view diagram of the wafer deflection just before the completion of the bonding process.

In our experiments we observed first with the bare eye the wafer edge position 87 on the opposite side relative to the bond starting position 83, as shown in FIG. 5E. Later we used a set up with a high precision laser distance sensor 90 to verify the observation by a measurement. The distance sensor 90 works on the principle of laser triangulation. In the laser triangulation method a laser emits a beam towards a target. The target reflects that beam back to the receiving element. The angle of refraction varies proportionally to the distance of the object. The sensor measures this angle and then calculates the distance. In one example, the distance sensor is purchase from Baumer Ltd, of Southington, Conn.

Figure 5F:
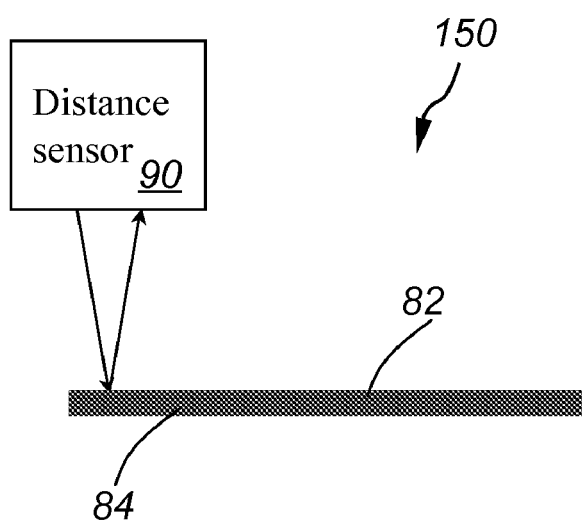
Figure 6:
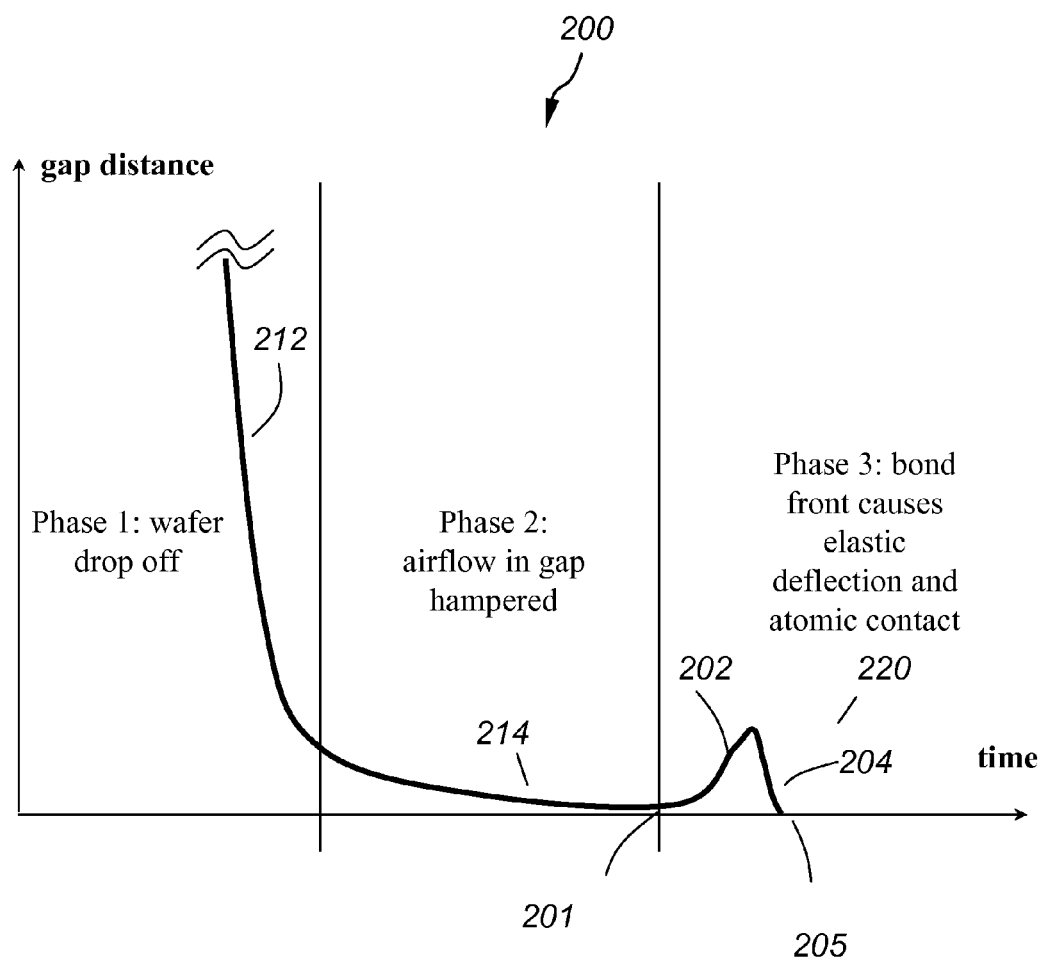
FIG. 6 depicts a graph of the theoretical gap distance between the wafer edges as a function of time during the entire bonding process.

Using the set-up of FIG. 5B, we observed that the floating properties of the upper wafer 82 on top of the lower one 84 change with time in terms of the air gap distance 85. Referring to FIG. 6, a graphical representation 200 of the gap distance 85 versus the time during the bonding operation indicates the presence of three phases 212, 214, 220. In the first phase 212 the proximity spacers 88a, 88b are removed and the upper wafer 82 drops down onto the lower 84 as shown in FIG. 3 and FIG. 5B. In this phase of the process the two wafers behave like two parallel plastic plates. After the initial drop of the upper wafer 82 the gravity force of the upper wafer is pushing it down and is pressing air out of the interface quickly until the airflow is hampered due to the boundary layer on each wafer. A microscopic air gap 85 remains between the wafers, as shown in FIG. 5C. The second phase 214 of the bond process is determined by changes of the microscopic gap. We observed that the remaining air gap 85 decreases as the gravity force of the upper wafer is still pushing down. The decrease of the remaining air gap is nonlinear relative to the process time. Without any external force application two perfectly flat surfaces as of the semiconductor wafers theoretically will never bond spontaneously because of the remaining air boundary layers, which prevent atomic contact. The dimensions of the remaining gap of phase two is determined by wafer size, thickness and surface properties. In the third phase 220 the bonding is initiated (201), typically at one single point to achieve a single bond front propagation and to exclude air bubble formation. The two substrates are elastically deflected during the bond front propagation as the surfaces are coming in atomic contact and push the remaining air out of the interface along the bond front, as shown in FIG. 5D. Initially, we observe an increase 202 of the gap distance between the substrates when watching the edges of the two substrates at certain angle as shown schematically in FIG. 5E. Shortly after that we see a fast decrease 204 of the distance gap, as shown in FIG. 5F. Finally a minimum distance is achieved 205, which indicates that the overall bonding process is completed.

Figure 7:
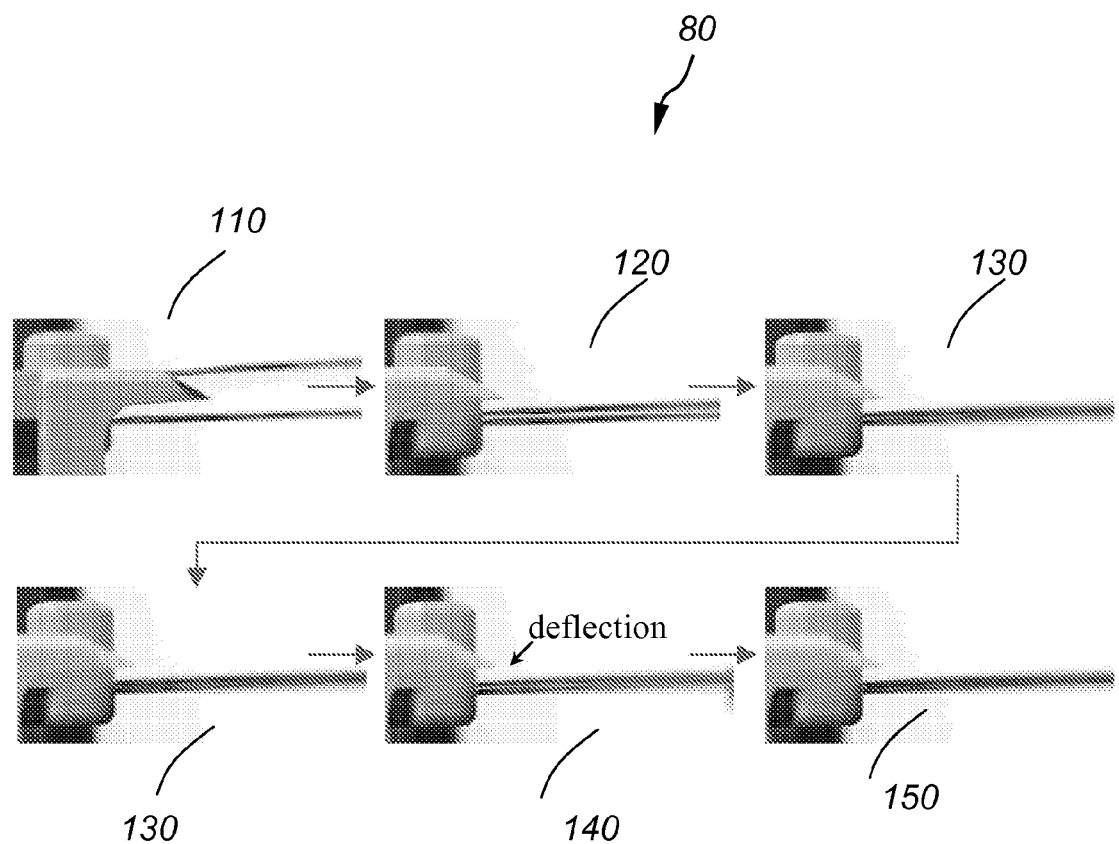
FIG. 7 depicts real time images of the two wafer edges during various instances of the bonding process.
Figure 8:
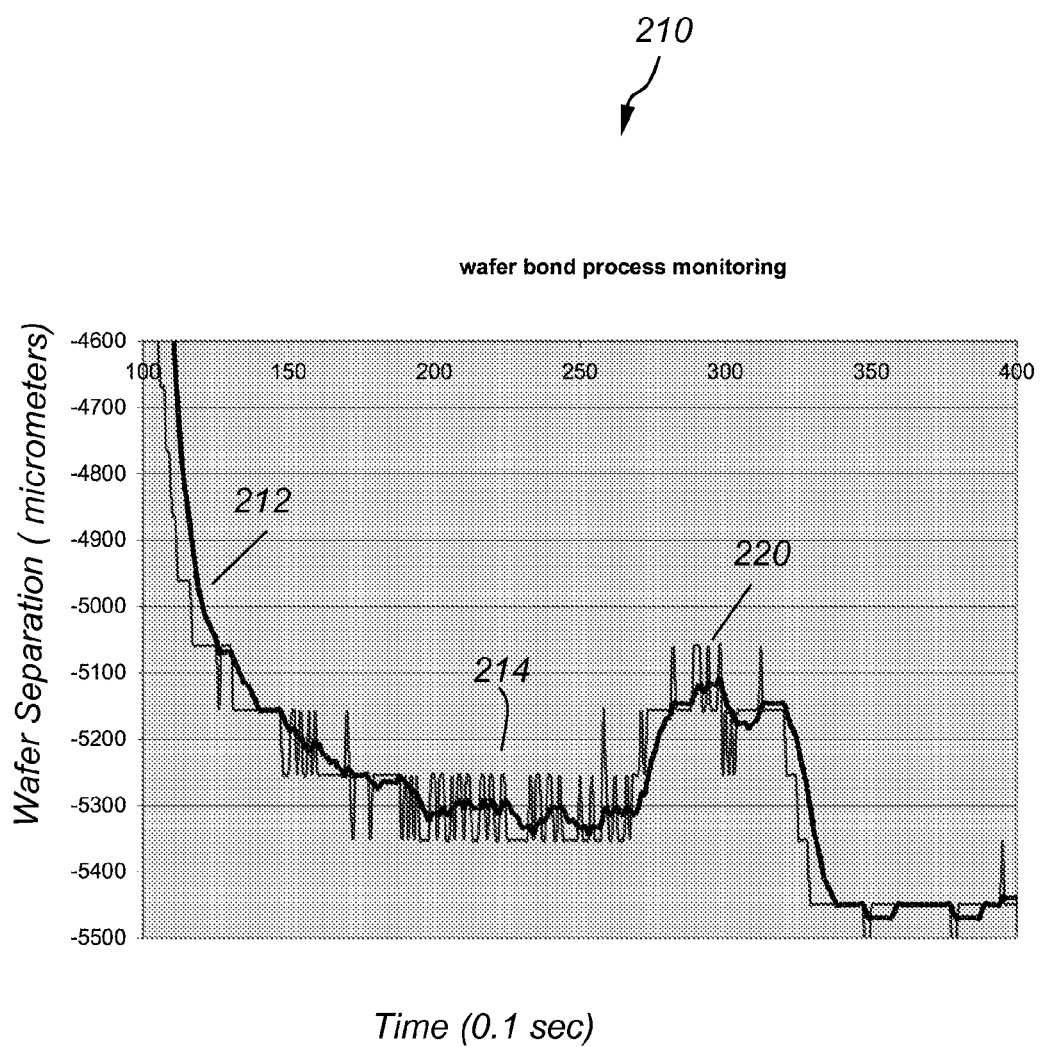
FIG. 8 depicts a graph of the real time gap distance between the wafer edges as a function of the real time observed during real time monitoring of the entire bonding process.

The present method and device for monitoring of the bonding time is based on measurements of the elastic deflections of the substrates. The measurement can be realized with optical, non-optical or non-contact methods. One technical solution is a sensor system placed above the two substrates monitoring the distance changes relative to the upper wafer. The relation of gap distance between the two substrates in the three phases of the described bonding process and time is shown schematically in FIG. 6. Real time images of the various stages are shown in FIG. 7 and measurement data by using a high precision laser distance sensor are given in FIG. 8. The bonding time is determined by taking the difference between the bond initiation time (201) and the end (205) of phase 3 of the process.

Additionally, a bond frond propagation speed is calculated by dividing the distance between the bond initiation point 83 and the deflection measurement point 87 by the bonding time. A bond quality control parameter is also determined by first calculating or experimentally determining an optimum bonding time for a given wafer size, material, and surface quality, then real time monitoring and measuring of the bonding time with the described method and system of this invention and then comparing the measured bonding time to the optimum bonding time. Deviations of the actual bonding time from the optimum bonding time indicate incomplete or defective bonding.

Among the advantages of this invention may be one or more of the following. In-situ and in real time monitoring of the bonding time. Especially for wafer bonding processes in high volume production this measurement provides additional process safety to the traditional statistical process control. Also the method may be applied for monitoring of the bond quality, i.e., determining void free bonding and failed bonds. Current state-of-the-art approach for a bonding sequence is to program an extended wait time after bond initiation to be sure the bond is completed. The present method and device of this invention may be applied to determine the exact bonding time and report the exact time when the bonding is finished. Furthermore the throughput of a production wafer bonding system may be improved and optimized. Also the present method and device may be a useful development tool for wafer bonding R&D work.

Several embodiments of the present invention have been described. Nevertheless, it will be understood that various modifications may be made without departing from the spirit and scope of the invention. Accordingly, other embodiments are within the scope of the following claims.

What is claimed is:

1. A method for measuring the bonding time between two semiconductor structures in-situ and in real time during a bonding operation comprising:

positioning a first surface of a first semiconductor structure directly opposite and in contact with a first surface of a second semiconductor structure;

initiating bonding between said first surfaces of said first and second semiconductor structures by applying a force at a first point of a second surface of said first semiconductor and thereby forming a bond interface between said first surfaces of said first and second semiconductor structures, wherein said second surface is opposite to said first surface of said first semiconductor structure;

measuring a deflection of a second point of said second surface of said first semiconductor away from said first surface of said second semiconductor structure during the propagation of said bond interface throughout the entire first surface areas of said first and second semiconductor structures, wherein said second point is positioned at a first distance from said first point; and measuring said bonding time by taking the difference between the time said deflection reaches a minimum value and the time said force is applied.

2. The method of claim 1, wherein said second point is positioned diametrically opposite to said first point.

3. The method of claim 1, wherein said first point is located at the center of said second surface of said first semiconductor structure and said second point is located at an edge of said second surface.

4. The method of claim 1, wherein said deflection of said second point of said second surface of said first semiconductor away from said first surface of said second semiconductor structure initially increases and then decreases to said minimum value.

5. The method of claim 1 wherein said deflection is measured with a distance sensor.

6. The method of claim 5 wherein said distance sensor comprises a laser distance sensor operating on the principle of laser triangulation.

7. The method of claim 1 further comprising calculating a bond propagation speed by dividing said first distance between said first and second points by said bonding time.

8. The method of claim 1 further comprising calculating a bond quality value by taking the difference between the measured bonding time and a previously determined optimum bonding time.

9. An apparatus for measuring the bonding time between two semiconductor structures in-situ and in real time during a bonding operation comprising:

equipment for positioning a first surface of a first semiconductor structure directly opposite and in contact with a first surface of a second semiconductor structure;

equipment for initiating bonding between said first surfaces of said first and second semiconductor structures by applying a force at a first point of a second surface of said first semiconductor and thereby forming a bond interface between said first surfaces of said first and second semiconductor structures, wherein said second surface is opposite to said first surface of said first semiconductor structure;

equipment for measuring a deflection of a second point of said second surface of said first semiconductor away from said first surface of said second semiconductor structure, during the propagation of said bond interface throughout the entire first surface areas of said first and second semiconductor structures, wherein said second point is positioned at a distance from said first point; and equipment for measuring said bonding time by taking the difference between the time said deflection reaches a minimum value and the time said force is applied.

10. The apparatus of claim 9, wherein said second point is positioned diametrically opposite to said first point.

11. The apparatus of claim 9, wherein said first point is located at the center of said second surface of said first semiconductor structure and said second point is located at an edge of said second surface.

12. The apparatus of claim 9, wherein said deflection of said second point of said second surface of said first semiconductor away from said first surface of said second semiconductor structure initially increases and then decreases to said minimum value.

13. The apparatus of claim 9, wherein said deflection is measured with a distance sensor.

14. The apparatus of claim 13, wherein said distance sensor comprises a laser distance sensor operating on the principle of laser triangulation.

15. The apparatus of claim 9 further comprising equipment for calculating a bond propagation speed by dividing said first distance between said first and second points by said bonding time.

16. The apparatus of claim 9 further comprising equipment for calculating a bond quality value by taking the difference between the measured bonding time and a previously determined optimum bonding time.

\* \* \* \* \*